(12) United States Patent
Andersson et al.

(10) Patent No.: US 9,285,429 B2
(45) Date of Patent: Mar. 15, 2016

(54) ARRANGEMENT AND METHOD FOR DETERMINING THE STATE OF A BATTERY BASED ON A CAPACITY OF THE BATTERY

(75) Inventors: Arne Andersson, Ljusterö (SE); Mikael Strandljung, Farsta (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 289 days.

(21) Appl. No.: 13/985,727

(22) PCT Filed: Feb. 21, 2011

(86) PCT No.: PCT/SE2011/050187
§ 371 (c)(1),
(2), (4) Date: Aug. 15, 2013

(87) PCT Pub. No.: WO2012/115542
PCT Pub. Date: Aug. 30, 2012

(65) Prior Publication Data
US 2013/0320992 A1 Dec. 5, 2013

(51) Int. Cl.
*H01M 10/44* (2006.01)
*H01M 10/46* (2006.01)
(Continued)

(52) U.S. Cl.
CPC ......... *G01R 31/3606* (2013.01); *H01M 10/482* (2013.01)

(58) Field of Classification Search
CPC ....... H02J 7/0004; H02J 7/0009; H02J 7/026; H02J 7/0029
USPC .......... 320/116, 118, 122, 132, 135; 324/426, 324/427, 433; 702/63, 64
See application file for complete search history.

(56) References Cited

U.S. PATENT DOCUMENTS

| 5,894,222 A | 4/1999 | Hibino |
| 7,880,438 B1 | 2/2011 | Cohen et al. |

(Continued)

FOREIGN PATENT DOCUMENTS

| EP | 0112242 A1 | 12/1983 |
| EP | 1328052 A2 | 7/2003 |

(Continued)

OTHER PUBLICATIONS

Anbuky, A.H. et al. "VRLA Battery Capacity Measurement and Discharge Reserve Time Prediction." Twentieth International Telecommunications Energy Conference, Oct. 4-8, 1998, pp. 302-310, San Francisco, CA, USA.

(Continued)

*Primary Examiner* — Edward Tso
(74) *Attorney, Agent, or Firm* — Patent Portfolio Builders, PLLC

(57) ABSTRACT

A method for determining the state of a battery comprising at least two battery strings, wherein said battery strings are connected to a load and to a power supply unit, the method comprising: disconnecting (401) at least one first battery strings from said load; reducing (402) an output voltage of said power supply unit to said load below a first threshold value; discharging (403) at least one second battery string to said load; monitoring (404) the discharging of the at least one second battery string; determining (405) a capacity of said at least one second battery string based on at least in part the monitoring of discharging; and reconnecting (406) said at least one first battery strings to said power supply unit and to said load.

23 Claims, 6 Drawing Sheets

(51) Int. Cl.
*G01R 31/36* (2006.01)
*H01M 10/48* (2006.01)

(56) References Cited

U.S. PATENT DOCUMENTS

2005/0149280 A1 7/2005 Sharma et al.
2008/0164762 A1* 7/2008 Pecile .......................... 320/134
2010/0052615 A1* 3/2010 Loncarevic .................. 320/118
2012/0182021 A1* 7/2012 McCoy et al. ................ 324/433

FOREIGN PATENT DOCUMENTS

| JP | 2000356670 A | 12/2000 |
|----|--------------|---------|
| WO | 9745911 A1 | 12/1997 |

OTHER PUBLICATIONS

Office Action in EP application No. 11859108.0 mailed Aug. 7, 2014.

* cited by examiner

ARRANGEMENT AND METHOD FOR DETERMINING THE STATE OF A BATTERY BASED ON A CAPACITY OF THE BATTERY

TECHNICAL FIELD

The invention relates to a method and arrangement for determining the state of a battery.

BACKGROUND

More or less uninterrupted uptime of different critical loads in electrically powered systems is becoming increasingly important. Therefore systems of today often have adjoining power back-up arrangements to provide uninterrupted power to such critical load if the power from the utility line to the system is interrupted for whatever reason.

A power back-up arrangement normally comprises a battery for storing and providing back-up power. If the voltage to the load decreases below a threshold value, the stored charge in the battery will be provided to the critical load. The power of the battery will continue to be provided to the load until the power from the utility line has returned alternatively until the battery is drained of power.

Thus, in order to investigate the state of a battery in a power back-up arrangement, different tests on the battery may be needed. One such test is a capacity test. That is testing the battery's stored electric charge. The nominal specification of a battery may often only be valid at preset operational temperatures which normally are lower or higher than the actual operating temperature of the battery. This makes the nominal specification unreliable and unpractical in order to determine the capacity from the battery specification. Another uncertainty is the normal decrease in capacity of a battery affected by charge and discharge, i.e. capacity decrease in relation to the number of battery cycles the battery has been subject to as well as the decrease in capacity due to aging of the battery.

Several methods of predicting and measuring the capacity and status of a battery in a power back-up system exist. Measuring by discharge may be adding a risk of decreased capacity of the back-up power. Thus, different ways to of testing the status and capacity of a power back-up without discharge has been proposed. One example of such a method is performed by measuring impedance and/or conductance of the battery. Based on that measurement, the capacity and status of the battery can be theoretically determined. Another example is to discharge the battery to a certain level of its capacity and, based on such partly discharge test, determine the resulting capacity of the battery by extrapolation. These testing methods are however rather inaccurate and the remaining back-up power capacity to handle a mains interruption in connection to the test is sometimes unknown.

FIG. 1 is a schematic block diagram showing a power back-up system with a battery according to the prior art. The power back-up system is connected to a load 101 in order to provide uninterrupted power supply in the event of utility mains interruption.

In FIG. 1, the utility mains 109,109' are connected to a power supply 100 which is adapted to charge the battery strings 103,103' and to provide power to the load 101. The battery strings 103,103' are arranged to be in connection with the power supply 100 and load 101 in order to receive charge from the power supply 100 and to be capable of providing power to the load 101 if the utility mains 109,109' is interrupted.

FIG. 2 shows a similar arrangement as of FIG. 1 but with an additional arrangement for testing capacity by battery partial discharge. In FIG. 2, a switch 105 is arranged at the utility mains 109,109' and adapted to disconnect the utility mains 109;109' from the power supply 100. The arrangement further comprises battery test equipment 102 which is operatively connected to the switch 105. The battery test equipment 102 can also be operatively connected to the power supply 100. The battery test equipment 102 is adapted to interrupt the mains 109,109' by sending a switch signal to the switch 105. Such interruption is normally done manually by testing personnel. An alternative to interrupting the mains may enable the battery test equipment 102 to instruct the power supply 100 to reduce the output voltage below a minimal battery discharge level in order to ensure that the power provided to the load 101 is taken from the battery 103,103'. The battery test equipment 102 is further connected to a current sensor 104 and a voltage sensor 107 in order to monitor the discharge test. The discharge test arrangement illustrated in FIG. 2 normally requires manual intervention and manual supervision in order to perform a sufficient partial discharge without reaching critical levels.

SUMMARY

It is an object of the invention to address at least some of the limitations, problems and issues outlined above. It is also an object to improve the process of determining the status of a battery based on the capacity of the battery. It is possible to achieve these objects and others by using a method and an arrangement as defined in the attached independent claims.

According to one aspect a method for determining the state of a battery comprising at least two battery strings is provided. The battery strings are connected to a load and to a power supply unit. At least one first battery string is disconnected from the load. An output voltage of the power supply unit to the load is reduced below a first threshold value. The at least one second battery string is discharged to the load and the discharging of the at least one second battery string is monitored. A capacity of the at least one second battery string is determined based on at least in part the monitoring of discharging and finally reconnecting the at least one first battery string to the load.

This method may allow the determination of the capacity of a battery without a complete discharge of the battery. This method may further allow the determination to be automatic without manual intervention.

The above arrangement may be configured and implemented according to different optional embodiments. In one exemplary embodiment, the monitoring of the discharge comprises measuring at least one of a current and a voltage of the at least one second battery string during the discharge. In another embodiment the action of determining further comprises to obtain a time integral of the measured current of the at least one second battery string.

According to one exemplary embodiment, the state of the battery is determined based on the capacity of each of the battery strings comprised in the battery.

In another exemplary embodiment, the method further comprises disconnecting the at least one first battery string from the load and measuring at least one of a current and a voltage of the battery. The at least one first battery string is disconnected if the measured voltage is above a second threshold value and/or the measured current is below a third threshold value.

According to one exemplary embodiment, the method further comprises to detect whether the power from the utility line to the power supply unit is interrupted. If the power from the utility line to the power supply unit is interrupted the at least one battery string is reconnected to the load.

In one exemplary embodiment, at least one of the current and the voltage of the at least one second battery string is measured during recharge. The at least one first battery string is reconnected to the load if the measured current is below an associated fourth threshold value and if the measured voltage of the at least one second battery string is above a fifth threshold value.

According to one exemplary embodiment, the output voltage is reduced by disconnecting the power supply from the load.

According to another exemplary embodiment, an alarm message is generated if the capacity of one or more battery strings is below a sixth threshold value.

According to one exemplary embodiment, the load is an artificial load, wherein the artificial load is having selective power consumption.

According to another exemplary embodiment, the second battery string is disconnected from the load if the capacity of at least one second battery string is below a seventh threshold value.

According to another aspect, a battery arrangement is configured to determine the state of a battery. The battery is connected to a load and to a power supply unit. The battery comprises a switch which is adapted to disconnect each of at least one first battery string/s and at least one second battery string in the battery individually from the load. The battery arrangement also comprises a control unit which is adapted to instruct the switch to disconnect the at least one first battery strings from the load. The control unit is further adapted to instruct the power supply unit to reduce an output voltage to the load below a first threshold value and to monitor the discharge of the at least one second battery string. The control unit is further adapted to determine the capacity of the at least one second battery string at least in part based on the monitoring of the discharge and to instruct the switch to reconnect the at least one first battery string.

The above arrangement may be configured and implemented according to different optional embodiments. According to one exemplary embodiment, the battery arrangement further comprises at least one of, a current sensor which is used to monitor the discharge by measuring the current of the at least one second battery string, and a voltage sensor which is used to monitor the discharge by measuring the voltage of the at least one second battery string. The control unit is configured to obtain a time integral of the measured current of the at least one second battery string.

In one exemplary embodiment, the control unit is adapted to determine the state of the battery based on the capacity of each of the battery strings which is comprised in the battery.

According to another exemplary embodiment, the voltage sensor and the current sensor is further adapted to measure the voltage and current of the at least one first battery string, and wherein the control unit is adapted to measure at least one of the current and voltage via the voltage sensor or the current sensor, and to disconnect the first battery string if the measured voltage exceeds a second threshold value and/or if the measured current is below a third threshold value.

In one exemplary embodiment, the control unit is adapted to detect whether a power from a utility line, which is connected to the power supply unit, is interrupted. The control unit is adapted to instruct the switch to reconnect the at least one first battery strings to the load if the power from the utility line to the power supply is interrupted.

According to one exemplary embodiment the control unit is adapted to instruct the switch to reconnect the at least one second battery string to the load such that the at least one second battery string is recharged.

According to one exemplary embodiment, the control unit is adapted to measure at least one of the current and the voltage of the at least one second battery string using the voltage sensor and/or the current sensor during recharge, and wherein the control unit is adapted to reconnect the at least one first battery string to the load if the measured current is below a fourth threshold value and/or if the measured voltage is exceeding a fifth threshold value.

In one exemplary embodiment, the control unit is adapted to instruct the power supply unit to disconnect the power supply from the load.

According to another exemplary embodiment, the control unit is adapted to generate an alarm message if the capacity of one or more battery strings is below a sixth threshold value.

According to one exemplary embodiment, the load comprises an artificial load. The control unit is also adapted to instruct the artificial load to have preset power consumption.

According to another embodiment, the control unit is adapted to disconnect the at least one second battery string if the capacity of the at least one second battery string is below a seventh threshold value.

Further possible features and benefits of this solution will become apparent from the detailed description below.

BRIEF DESCRIPTION OF DRAWINGS

The invention will now be described in more detail by means of some example embodiments and with reference to the accompanying drawings, in which.

DETAILED DESCRIPTION

Figure 1:
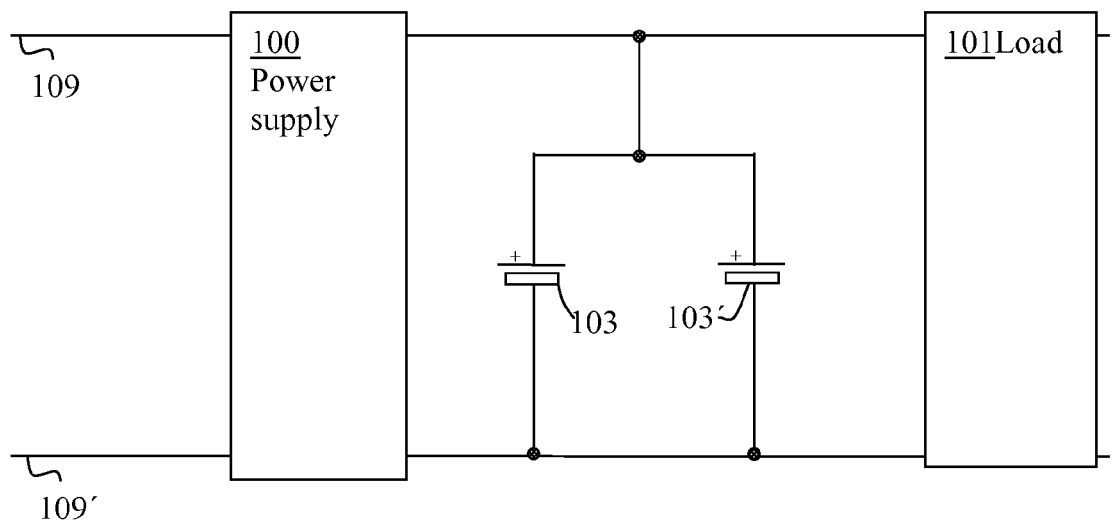
FIG. 1 is a block diagram illustrating a power back-up arrangement comprising battery blocks, according to the prior art.
Figure 2:
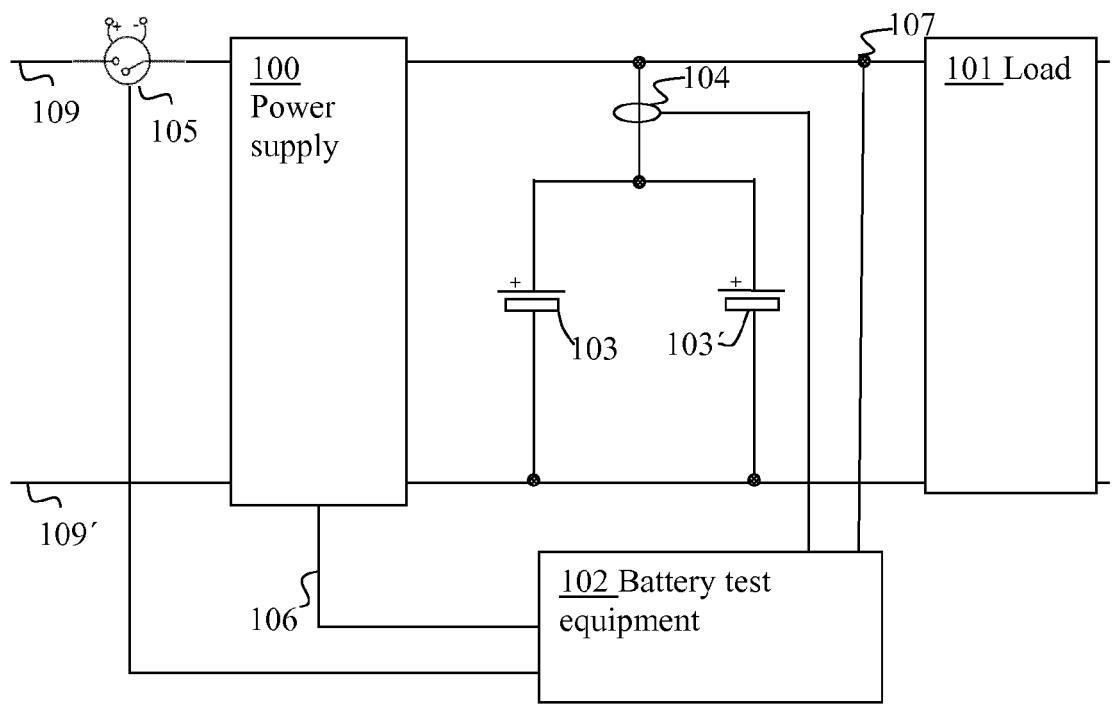
FIG. 2 is a block diagram illustrating FIG. 1 further comprising equipment for battery capacity testing, according to the prior art.

It has been recognized that the battery capacity is a good measurement to indicate the state of the battery. In this solution, it has also been recognized that using the battery capacity test arrangement according to the prior art has several different drawbacks. In most systems, it is unacceptable to completely discharge the battery storing the backup power. If a utility line interruption would occur during or closely after a discharge test, a very limited power reserve is left in the battery and the system may go down too rapidly. Thus, a complete discharge of the entire battery in order to determine its capacity is most often not possible.

In this solution it has further been identified that that the battery capacity may not be determined with high accuracy unless the battery is discharged close to its capacity. A partial discharge test requires extrapolation. The accuracy of such extrapolation may often be poor and insufficiently accurate. Discharge tests performed according to the prior art normally requires manual intervention. That is that service personal is needed in order to determine the capacity of the battery in a back-up arrangement.

In the following, a detailed description of a method and arrangement for determining the state of a battery is disclosed. Briefly described, the suggested battery arrangement determines the capacity of an isolated part of the battery by performing a discharge test without completely discharging the battery.

The term "battery block" shall in this description mean a unit which has the capability to store, discharge and recharge electrical power.

The term "battery string" shall in this description be understood to comprise two or more battery blocks which may be arranged in serial connection with each other.

The term "battery" shall in this description be understood to comprise two or more battery strings which are normally connected in parallel to each other.

The term "battery capacity" in this description is the amount of charge a battery is capable of storing. This is normally measured by the metrics ampere-hours (Ah) or alternatively in Watt-hours (Wh) which are well-known in the art. The battery capacity may be determined by performing a time integration of the electric current which is provided by the battery to a load. By performing time integration of the provided current, the variation of the properties of the load may be accounted for.

The term "battery string capacity" is meaning the capability of storing charge as described above for the term battery capacity. However, since the battery comprises a plurality of battery strings, this term is defining the capacity of a part of the battery. The battery capacity may be equal to the sum of the capacity of each and every battery string comprised in the battery.

The term "normal operation" is in this description describing the normal operational mode of the battery arrangement and the surrounding system. In such mode, the battery is sufficiently charged and connected to a Power Supply Unit (PSU) and to the load. The power is uninterruptedly provided from the utility mains via the PSU to the load and the battery.

Figure 3:
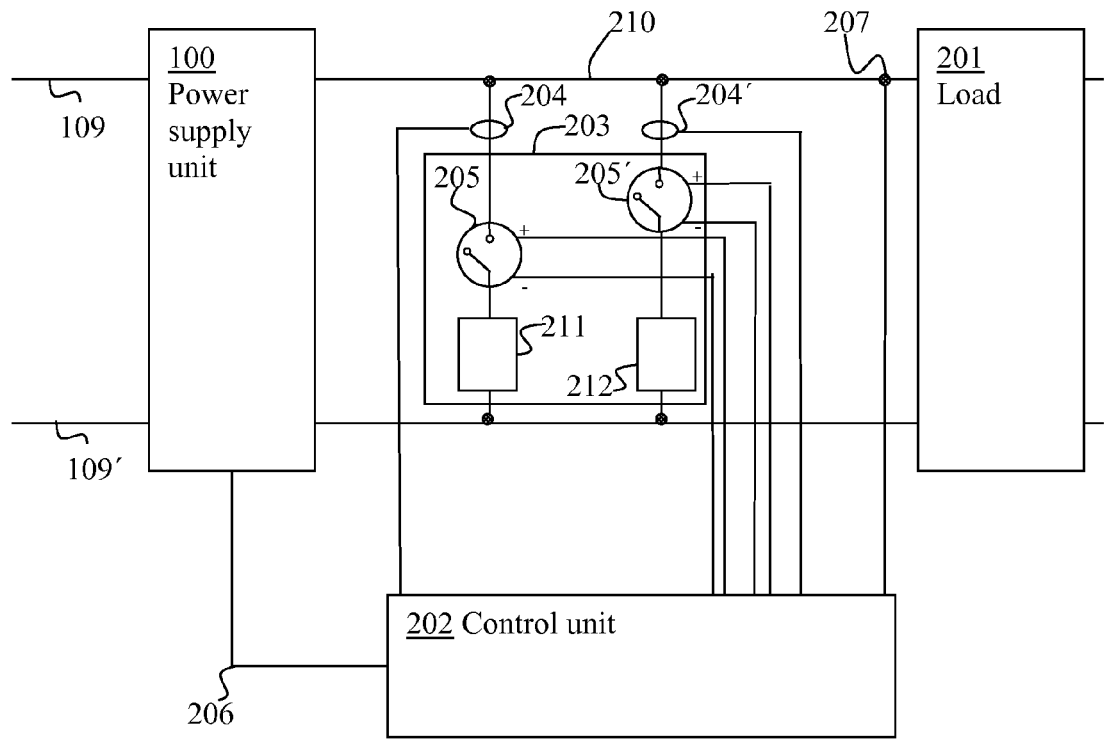
FIG. 3 is a block diagram illustrating a power back-up arrangement comprising a battery and a control unit, according to one example embodiment.

With reference to FIG. 3, a battery arrangement in a power back-up system will now be described in some detail. Power from a utility line may be distributed by the mains 109;109' to a PSU 100. The PSU 100 may provide converted alternating current to a direct current having characteristics according to the need of the system served by to the PSU 100. The PSU 100 is further connected to a bus 210. The bus may be arranged to connect a load 201 and a battery 203 to the PSU 100. Hence, the PSU 100 provides power to the load 201 during normal operation. The PSU 100 further provides power to the battery 203 and thereby enabling the battery to recharge. The battery 203 may comprise two or more battery strings 211;212, wherein each of the battery strings 211;212 comprises one or more battery blocks in serial connection. The battery will be further described below. The battery strings 211;212 of the battery 203 may further be selectively and independently isolated from the load 201 by a fast controllable switch 205; 205'. The switch 205;205' may be arranged in serial to each battery string 211;212 and further adapted to individually isolate the battery string from the load 201 and from the PSU 100. According to an alternative embodiment (not shown), the switch 205;205' may be arranged and adapted such that the load 201 and the PSU 100 can be isolated from each of the battery string individually. Thereby according to one example, a battery string 211;212 can be connected to the PSU 100 while having the same battery string 211;212 disconnected from the load 201, and thereby enabling the battery string 211;212 to be charged prior re-connection to the load 201.

The arrangement illustrated in the block diagram of FIG. 3 further comprises a control unit 202. The control unit 202 is operatively connected 206 to the PSU 100. The control unit 202 may be adapted to regulate the output voltage of the PSU 100 to the load 201 and also via the bus 210 to the battery 203. The arrangement of FIG. 3 further comprises a voltage sensor 207. The voltage sensor 207 may be arranged at the bus 210 which is connecting the PSU 100 to the load 201 and to the battery 203. The control unit 202 may be operatively connected to the voltage sensor 207 and is thereby adapted to measure the voltage of the PSU 100 and also adapted to measure the voltage which may be provided by the battery 203. The control unit 202 is further operatively connected to one or more current sensors 204;204'. The current sensors 204;204'may reside within or outside the battery 203. However, the current sensors 204;204' are adapted to measure the current of an individual battery string 211;212. The current sensors 204;204'may alternatively be adapted to measure a section comprising one or more battery strings 211;212. Thus, the control unit 202 may determine the battery current by means of the current sensors 204;204' during normal operation. Nonetheless, the control unit 202 is also adapted to measure the amount of charge provided by a battery string 211;212 using the current sensor 204;204' during discharge of the battery string 211;212. In addition to measuring the current of each battery string 211;212, the control unit 202 may also be operatively connected to a fast switch 205;205'. The switch 205;205' is adapted to isolate each of the battery strings individually as previously described, in response to instructions issued by the control unit 202.

The control unit 202 is also adapted to instruct the PSU 100 to reduce the output voltage below a preset first threshold value. By reducing the voltage of the PSU 100 and isolating a first battery strings 211;212, the control unit 202 is able to ensure that power to the load 201 is only provided by a second battery string 211;212. In one embodiment, the control unit 202 may instruct the PSU 100 to disconnect from the load 101.

The control unit 202 which is adapted to determine the state of the battery will now be described. In one optional embodiment, the control unit 202 is adapted to determine the initial state of the battery 203. The control unit 202 is hence adapted to measure whether or not the status of the battery 203 allows for a discharge test. That is whether or not the battery voltage, as may be measured by the voltage sensor 207, exceeds a respective second threshold value, and/or whether or not the battery current, is below a respective third threshold value. If the measured current and/or voltage of the battery have not reached their respective associated second or third threshold value, the capacity test would typically be aborted and optionally an alarm message would be generated. On the other hand, if the measured current and/or voltage of the battery have reached their associated respective second or third threshold value, the control unit 202 is then adapted to instruct the switch 205;205' to isolate one or more first battery strings 211;212.

The control unit 202 is further adapted to determine the capacity of the second battery string 211;212. The capacity determination may be based on the measured time and at least one of the measured current and voltage. The voltage may be measured by the voltage sensor 207 and the current may be measured by the current sensor 204;204'.

The control unit 202 is further adapted to reconnect the second battery strings 211;212 to the PSU 100 if the measured voltage of the second battery string 211;212 is indicating a discharged state. The control unit 202 is adapted to reconnect the second battery string 211;212 to the PSU 100 such that a recharge voltage is applied. The control unit 202 may also be adapted to reconnect the second battery string 211;212 to the load 201 if the second battery string 211;212 is recharged, i.e. the voltage of the second battery string 211;212 exceeds a fourth threshold value and the battery current is below a fifth threshold value. Thus, when the second battery string 211;212 is reconnected, the battery 203 is back in normal operation. The control unit 202 is further adapted to store the capacity result from a first discharge test, select another battery string 211;212 and perform a discharge test. By determining the capacity of at least one or more, or alternatively each battery string, the control unit 202 may be enabled to determine the capacity of a part of, or the whole, battery by adding each of the determined battery string capacity.

The above arrangement can be modified in different ways without departing from the invention. For example, although FIG. 3 only shows two battery strings 211;212, it should be noted that this solution can be applied to an arrangement comprising any number of plural of battery strings. Moreover, the switch 205;205', the current sensors 204;204'or the voltage sensor 207 may be configured in various different manners without departing from the invention.

Figure 4:
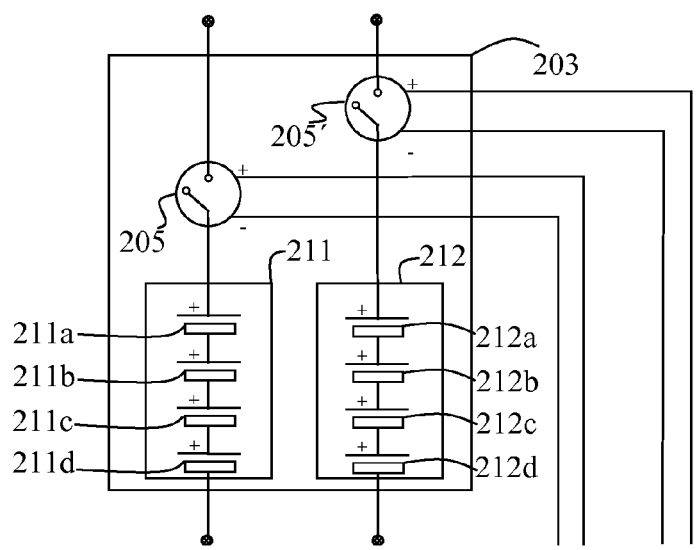
FIG. 4 is a block diagram illustrating a battery arrangement, according to an example embodiment.

Now reference is made to FIG. 4 which illustrates a block diagram of the battery 203 described in FIG. 3. The battery 203 comprises two or more battery strings 211;212. A battery string 211;212 comprises at least one battery block 211a-d; 212a-d, wherein each battery block 211a-d; 212a-d may be arranged in serial connection within the battery string 211; 212. A battery block 211a-d; 212a-d may be adapted to store, discharge and recharge power. One example of such battery block 211a-d; 212a-d may comprise a mechanical unit and one or more battery cells. The battery block 211a-d; 212a-d may further comprise two terminals adapted to connect the battery block to the battery string 211;212. In an alternative embodiment, the battery strings 211;212 may be connected in parallel to a junction wire (not shown) which is connected to the battery bus 210. Such alternative embodiment will only allow for a two or more battery strings in conjunction to be tested.

The above arrangement can be modified in different ways without departing from the invention. For example, although FIG. 4 shows an example where each battery string 211;212 comprises four individual battery blocks 211a-d; 212a-d, a solution comprising any number of battery blocks is possible.

This solution may enable a substantially or fully automated system for determining the capacity of a battery by performing discharge tests without manual intervention. At the same time, the system is subjected to less risk compared to the test which exists in the art. Since all battery strings may be tested one at a time, the stored charge will theoretically never have to go below 50% in a battery comprising two substantially equal battery strings. Hence, a battery comprising ten battery strings with equal capacity may have the remaining charge corresponding to approximately 90% of the total battery capacity after a complete discharge test of one battery string. The risk of a failing battery causing the system to go down during or after discharge test is reduced compared to prior art arrangements.

Figure 5:
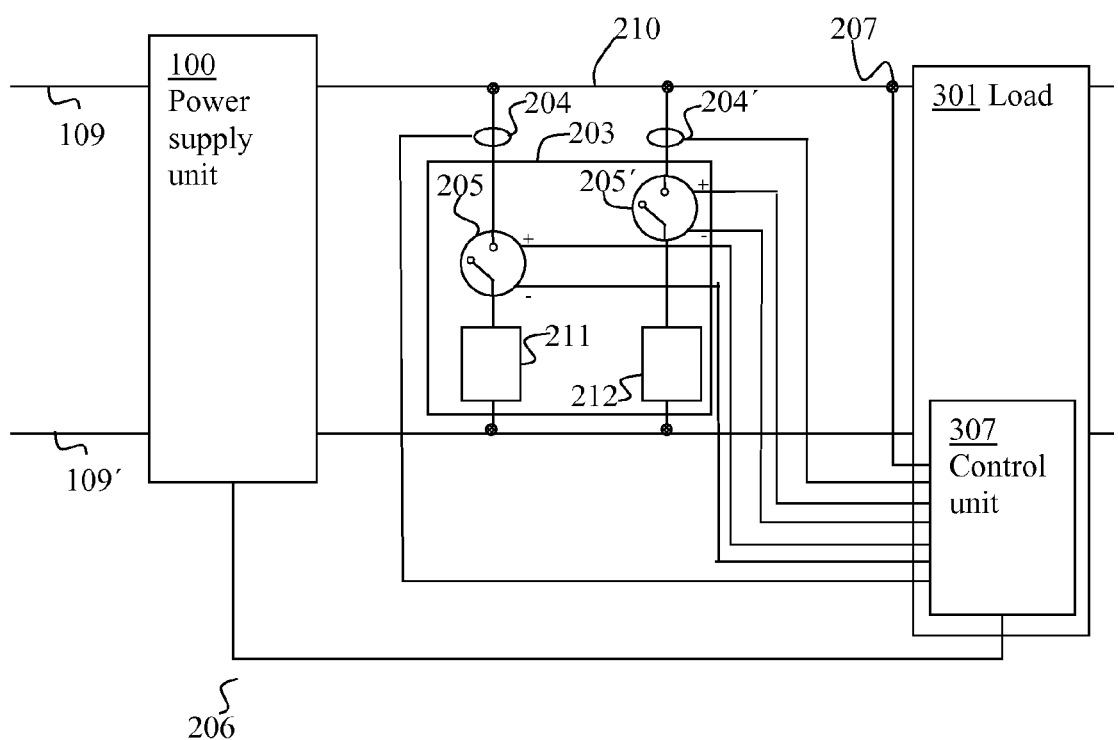
FIG. 5 is a block diagram illustrating a power back-up arrangement comprising a battery and a control unit which is integrated in the load, according to another example embodiment.

Now with reference to FIG. 5 which illustrates an arrangement similar to the one of FIG. 3, although, in this embodiment the control unit 307 is arranged within the load 301. The person skilled in the art will appreciate the various different ways of integrating the control unit 307 into other units than the load 301 as shown in FIG. 5. For instance, the control unit 307 may be arranged within the PSU 100, or alternatively also within the battery 301 itself.

The control unit 202;307 is further adapted to generate an alarm message based on the determined capacity of the battery or one or more battery strings 211;212, according to one embodiment. For example, if the capacity of a battery string 211;212 is below a sixth threshold value, the alarm message may be generated such that it comprises information regarding the battery status and/or information regarding the identity of the back-up arrangement.

The control unit 202;307 may also be adapted to transmit the alarm message to a central service unit (not shown) or another appropriate entity. The alarm message may be transmitted from the control unit 202;307 to the central service unit by means of connectivity and data transmission which exists in profusion in the art. A control unit 202;307 adapted to transmit an alarm message may enable service personnel to rapidly acquire the status of the battery 203 of the power back-up arrangement. Moreover, the service personnel may be enabled to optimize their service visits and to more efficiently spend resources on batteries which are in need of service. This may bring increased service efficiency compared to the state of the art where tests of all batteries are performed by frequent service visits.

According to one embodiment, the load 201;301 may comprise an artificial load. Thereby, a controlled and managed discharge may be performed which may lower the risk of failure in relation to for example sudden discharges. The term "artificial load" shall in this description mean a load which may primarily used for test purposes. Thus, the load may not have any practical function. Properties of the artificial load, e.g. the effect, may be settable such that different discharge test may be performed. For example, according to example of a discharge test, the artificial load may be set to have a low effect and thus the tested battery string will have a long discharge time.

According to one non-limiting example, the load 201 may be a so-called Mission Critical System (MCS) which requires uninterrupted power supply. Such MCS may be vital to the function of a service or the function of another system. According to another non-limiting example, the load may be a Radio Remote Unit, such as a Radio Base Station for providing a radio interface to a User Equipment.

The person skilled in the art will appreciate that the control unit 202;307 and or the PSU 100 may be implemented using standard circuit technologies, which exist in profusion. For example, the control unit 202;307, PSU 100 or the load 301 can be implemented using discrete electronic components, using an integrated circuit, using programmable circuitry or using any combination thereof. The control unit 202;307, PSU 100 or the load 301 may also be implemented using one or more processors programmed with suitable computer program or other types of software. Such processor may be a single CPU (Central processing unit), or could comprise two or more processing units. For example, the processor may include general purpose microprocessors, instruction set processors and/or related chips sets and/or special purpose microprocessors such as ASICs (Application Specific Integrated Circuit). The processor may also comprise board memory for caching purposes.

The computer program may be carried by a computer program product in the control unit 203;307 connected to the processor. The computer program product comprises a computer readable medium on which the computer program is stored. For example, the computer program product may be a flash memory, a RAM (Random-access memory), a ROM (Read-Only Memory) or an EEPROM (Electrically Erasable Programmable ROM), and the program modules could in alternative embodiments be distributed on different computer program products in the form of memories within battery arrangement.

According to another aspect of the invention, a method is provided for determining the state of a battery which comprises a plurality of battery strings. The state may be based on the capacity of the battery which may be determined by measuring the energy storage capacity of at least one of the battery strings. The methods described in FIG. 6 to FIG. 8 may be implemented in any of the arrangements above described and illustrated in FIGS. 3-5.

Figure 6:
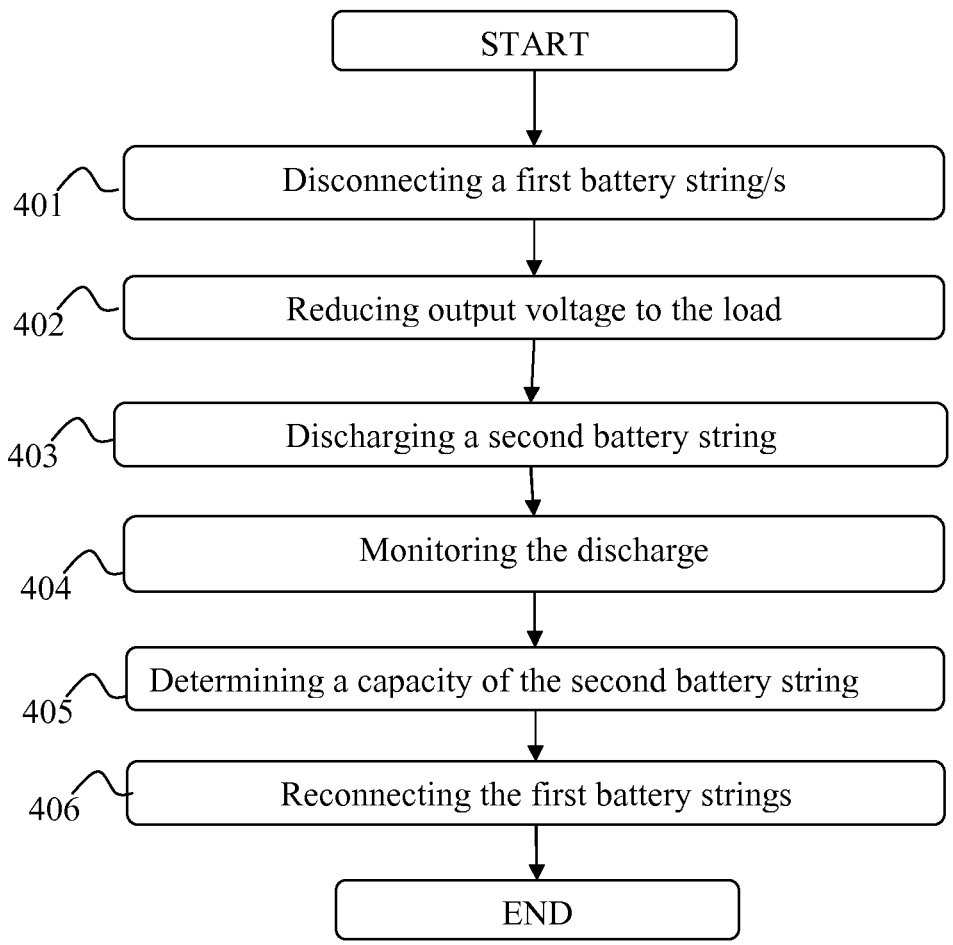
FIG. 6 is a flow chart illustrating a procedure of testing the capacity of a battery string, according to an example embodiment.

Now with reference to FIG. 6 which illustrates a flow chart of a method for determining the capacity of a battery string. The battery comprises at least one first battery string and a second battery string. The first battery string is disconnected during determination of the capacity of a second battery string. Thus, the first battery string may be utilized as a back-up power source if the power from the utility line is interrupted during the discharge test of the second battery string. The first battery string is disconnected in action 401, in order to enable the load to be powered by a second battery string when the power from a Power Supply Unit (PSU) is disconnected or reduced. In an action 402, the voltage from the PSU to the load is reduced below a first threshold value, such that only the second battery string provides power to the load. The second battery string is now discharged to the load, in to action 403. In action 404 the discharge of the second battery string is monitored in order to provide a basis for determining the capacity of the second battery string. In action 405 the capacity of the second battery string is determined, at least partly, on the result from the monitoring action 404. In one embodiment, the discharge time may serve as one parameter. The discharge time may for example be from the moment when the voltage of the PSU is reduced in action 402 to the moment when the battery string is discharged, e.g. when the voltage of the battery string approaches an associated respective terminal voltage. In action 406, the output voltage of PSU is restored to a level which is an operational level and the first battery string which has been disconnected in action 401 is reconnected to the load and to the PSU and that the. Hence, the first battery strings may now return to a state of normal operation while the second battery string is recharging in order to serve as a first battery string in a subsequent discharge test, alternatively to return to normal operation. According to one embodiment, the action of monitoring 404 also comprises to measure at least one of the voltage and the current of the second battery string. Consequently, the result of the measurement may also serve as an additional basis for determining the capacity of the second battery string.

It is generally understood that the skilled person may measure other parameters indicating the capacity of a battery string without departing from the invention. For example, various ways to derive the current or voltage of a battery is well-known in the art. Thus, the method may be performed by measuring another parameter which indicates, or which may be converted to indicate, the amount of charge provided by the battery. Determining the state of the battery may require testing one, several or each of the battery strings comprised in a battery. Thus, the following figures will now disclose methods for testing more than one battery strings. However, it should be appreciated by the person skilled in the art that repeating the method of FIG. 6 may be done without departing from the invention.

Figure 7:
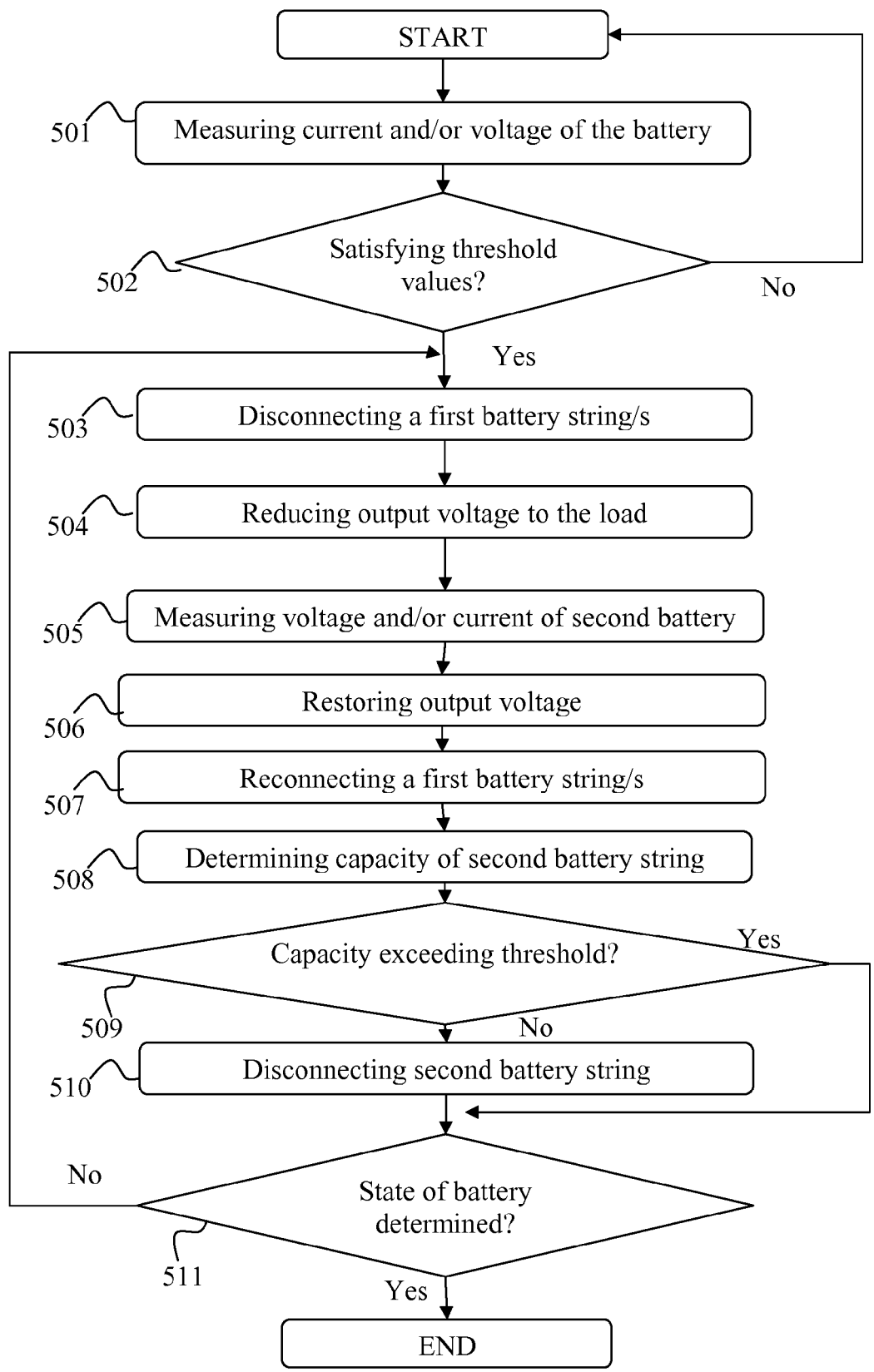
FIG. 7 is a flow chart illustrating a procedure of testing the capacity of a battery string, according to an example embodiment.

Now referring to FIG. 7 which is illustrating a flow chart of an alternative embodiment of the method for determining the capacity of a battery which is an extension of the method described in FIG. 6. A first action 501 comprises measuring at least one of the current of the battery and the voltage of the battery. The first battery string is disconnected in action 503 if the measured current is below a second threshold value and the measured voltage is above a preset third threshold value. In the contrary case wherein the at least one of the respective second and third threshold values is not reached, the method may be aborted and/or an alarm message may be generated indicating the state of the battery. Thus, performing a discharge test according to the method of FIG. 7 may normally only be initiated if the no initial battery capacity deficiency is detected and if the battery is fully charged.

The method comprises disconnecting the first battery string in action 503 enabling the load to be powered by a second battery string when the power from the PSU is disconnected or reduced. An action 504 comprises reducing the voltage from the PSU to the load to a value which is below a preset first threshold value, such that only the second battery string provides charge to the load. Action 505 comprises measuring the voltage and/or current provided by the second battery string such that the amount of charge provided to the load can be determined. In action 506 the output voltage of the PSU is restored to an operational level such that operational power is provided to the load and to recharge the second battery string. When the second battery string is recharged, the first battery strings are reconnected to the load and to the PSU in action 507.

The action 508 comprises determining the capacity based on the measured values of action 505. The action 508 of determining may be executed by performing time integration of the current provided by the second battery string during discharge. The measured discharge time may for example be from the moment when the voltage of the PSU is reduced in action 504 to moment when the battery string is discharged, e.g. when the voltage of the battery string approaches an associated respective terminal voltage. If the capacity of the second battery string is unacceptable, i.e. the capacity is measured corresponding to an insufficient level in a conditional action 509 the method comprises a further action of disconnecting the second battery string from the PSU and also from the load in 510. If the capacity of the second battery string is acceptable, it will stay connected to the load and to the PSU.

In an optional action 511, the actions of 501 to 509 can be repeated enabling the determination of the state of the battery based on the capacity of one or more battery strings.

Figure 8:
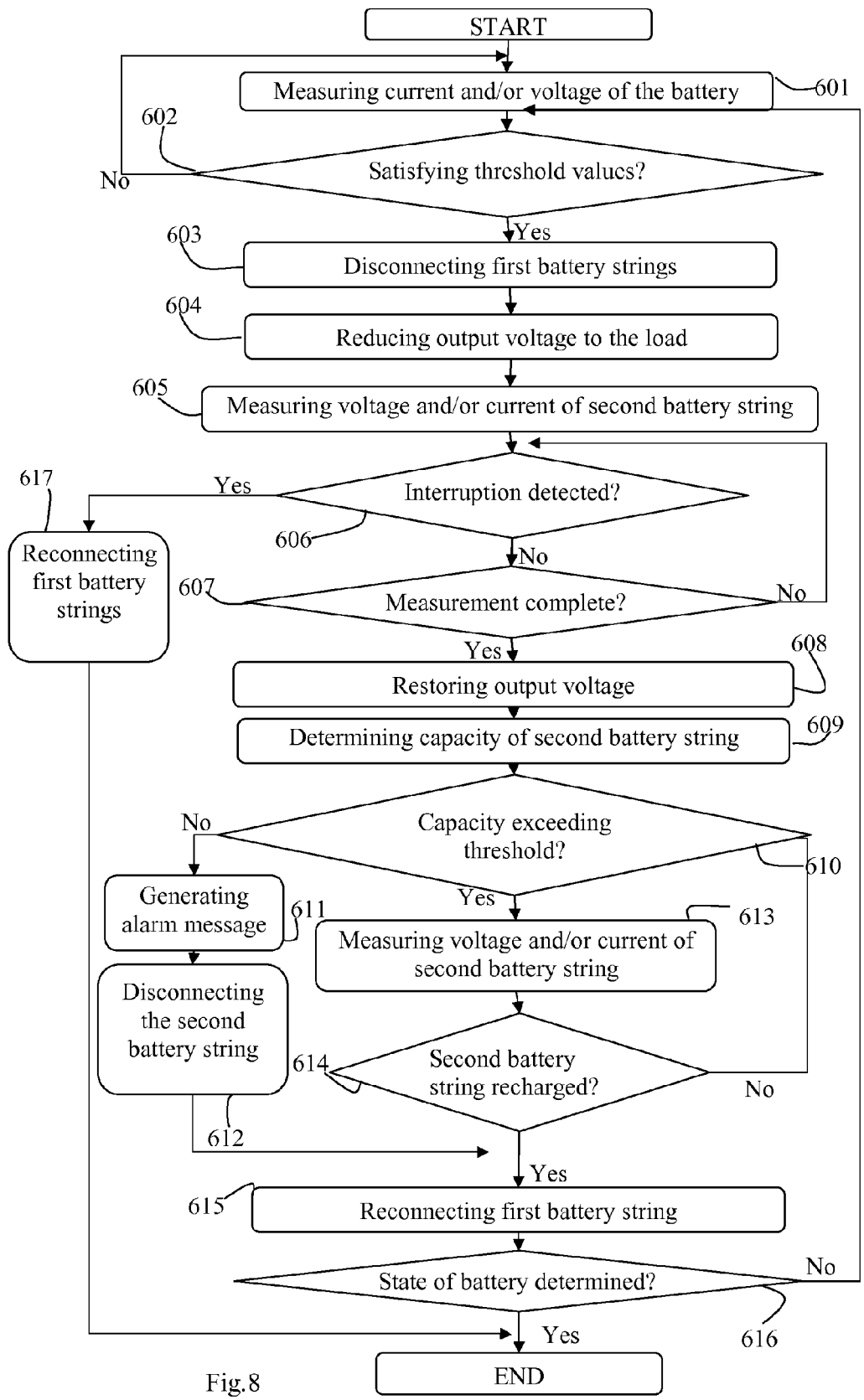
FIG. 8 is a flow chart illustrating a procedure of testing the capacity of one or more battery strings, according to an example embodiment.

Now with reference to FIG. 8 which is a flow chart describing a method for determining the state of a battery comprising several optional actions. In a first action 601 the current and voltage is measured in order to determine if the battery is in a state in which a discharge test is acceptable to perform. If the battery current is above a preset second threshold value, or if the battery voltage is below a preset third threshold value, initialization of the discharge test is aborted and restarted in action 602. According to one embodiment an alarm message could be generated to indicate the state of the battery in action 602. In action 603, one or more first battery strings are disconnected from the load and from the power supply unit. In order to ensure that the measured charge is provided by a second battery string, the action 604 comprises reducing the voltage of the power supply unit below a present first threshold value. Thus, the only power source connected to the load is the second battery string. Action 605 involves measuring the charge provided by the second battery string by measuring the voltage and/or the current provided by the second battery string to the load. Action 606 comprises to detect if a mains interruption occurs. If an interruption is detected during discharge of the second battery string, then the previously disconnected first battery string may be reconnected in action 617 such that the battery provides uninterrupted power to the load until the power from the mains returns or until the charge of the battery is drained.

If no interruption occurs, the second battery string can continue the discharge test until the second battery string approaches a discharged state. That is, the voltage of the battery approaches a voltage indicating that the second battery string approaches a discharged state according to action 607. In action 608 the output voltage of the PSU is restored such that recharge power and operational power is provided to the second battery string and the load respectively. Action 609 comprises of determining the capacity of the second battery string based on the measured values in actions 605-607.

The action 611 comprises generating an alarm message if the capacity of the second battery string is unacceptable, i.e. the capacity is below a preset sixth threshold value. Such alarm message may be transmitted, by means of connectivity which exists in profusion in the art, informing service personnel about the state of the second battery string as well as for example the identification of the back-up arrangement. If the determined capacity, on the other hand, is sufficient in action 610, the second battery string may be recharged. Moreover, if the second battery string is below the capacity threshold in action 610, the second battery string may be disconnected from the PSU and from the load in action 612.

In order to ensure that the second battery string is sufficiently recharged prior reconnection of the first battery strings, the voltage and current of the battery may be measured in action 613. If the voltage measured in action 613 is above a preset fourth threshold voltage and/or if the battery current measured in action 613 is below a preset fifth threshold value in action 614, the first battery strings are reconnected to the load and PSU in action 615. Thus the battery arrangement is back to a normal operation, and a next battery string may be subject to a discharge test in order to determine the state of the battery.

According to a last optional conditional action 616, the actions of the method described previously may be repeated in order to determine the state of the battery based on the capacity of one or more battery string. One or several of the actions of the method illustrated in FIG. 8 may be omitted without departing from the invention. It will be apparent to the skilled person that one or several of the described actions may be performed in a different order, as well as that one or several actions may be combined.

While the invention has been described with reference to specific exemplary embodiments, the description is generally only intended to illustrate the inventive concept and should not be taken as limiting the scope of the invention. For example, the terms "battery", "battery string", "load", "PSU", "voltage sensor", "current sensor" and "control unit", have been used throughout this description, although any other corresponding functions, parameters, nodes and/or units could also be used having the functionalities and characteristics described here. The invention is defined by the appended claims.

It must be noted that, as used in this specification and the appended claims, the singular forms "a", "an" and "the" include plural referents unless the context clearly dictates otherwise.

The invention claimed is:

1. A method for determining the state of a battery comprising at least two battery strings, wherein said battery strings are connected to a load and to a power supply unit, the method comprising:
disconnecting at least one first battery string from said load;
reducing an output voltage of said power supply unit to said load below a first threshold value;
discharging at least one second battery string to said load;
monitoring the discharging of the at least one second battery string;
determining a capacity of said at least one second battery string based on at least in part the monitoring of discharging;
detecting whether a power from a utility line to said power supply unit is interrupted; and
reconnecting said at least one first battery string to said load if the power from said utility line to said power supply unit is interrupted.

2. The method of claim 1, wherein monitoring the discharging of the at least one second battery string comprises measuring at least one of a current and a voltage of said at least one second battery string during the discharge.

3. The method of claim 2, wherein the action of determining further comprises to obtain a time integral of the measured current of said at least one second battery string.

4. The method of claim 1, wherein the state of said battery is determined based on the capacity of each of said battery strings comprised in said battery.

5. The method of claim 1, comprising: prior to disconnecting said at least one first battery string from said load, measuring at least one of a current and a voltage of said battery, wherein said at least one first battery string is disconnected if the measured voltage is above a second threshold value or the measured current is below a third threshold value, or both.

6. The method of claim 5, wherein at least one of the current and the voltage of said at least one second battery string is measured during recharge and wherein said at least one first battery string is reconnected to said load if the measured current is below an associated fourth threshold value and if the measured voltage of said at least one second battery string is above a fifth threshold value.

7. The method of claim 1, further comprising disconnecting said power supply unit from said load.

8. The method of claim 6, comprising generating an alarm message if the capacity of one or more battery strings is below a sixth threshold value.

9. The method of claim 1, wherein said load is an artificial load.

10. The method of claim 9, wherein said artificial load is having selective power consumption.

11. The method of claim 8, wherein said at least one second battery string is disconnected if the capacity of said at least one second battery string is below a seventh threshold value.

12. A battery arrangement configured to determine the state of a battery connected to a load and to a power supply unit, the battery arrangement comprising:

a switch that is adapted to disconnect each of at least one first battery string and at least one second battery string in the battery individually from said load; and a control unit that is adapted to instruct said switch to disconnect said at least one first battery string from said load, and to instruct said power supply unit to reduce an output voltage to said load below a first threshold value, and to monitor the discharge of said at least one second battery string, and to determine the capacity of said at least one second battery string at least in part based on the monitoring of the discharge, and to detect whether a power from a utility line which is connected to said power supply unit is interrupted, and to instruct the switch to reconnect said at least one first battery string to said load if the power from said utility line to said power supply is interrupted.

13. The battery arrangement of claim 12, comprising at least one of:

a current sensor arranged to monitor the discharge by measuring the current of said at least one second battery string; and a voltage sensor arranged to monitor the discharge by measuring the voltage of said at least one second battery string.

14. The battery arrangement of claim 13, wherein said control unit is configured to obtain a time integral of the measured current of said at least one second battery string.

15. The battery arrangement of claim 12, wherein said control unit is adapted to determine the state of the battery based on the capacity of each of said battery strings that is comprised in said battery.

16. The battery arrangement of claim 12, wherein said voltage sensor and said current sensor is further adapted to measure the voltage and current of said at least one first battery string, and wherein said control unit is adapted to measure at least one of the current and voltage of said battery via said voltage sensor or said current sensor, and to disconnect said first battery string if said measured voltage exceeds a second threshold value or if said measured current is below a third threshold value, or both.

17. The battery arrangement of claim 12, wherein said control unit is adapted to instruct said switch to reconnect said at least one second battery string to said load such that said at least one second battery string is recharged.

18. The battery arrangement of claim 16, wherein said control unit is adapted to measure at least one of the current and the voltage of said at least one second battery string using said voltage sensor or said current sensor during recharge, and wherein said control unit is adapted to reconnect said at least one first battery string to said load if the measured current is below a fourth threshold value or if the measured voltage is exceeding a fifth threshold value, or both.

19. The battery arrangement of claim 12, wherein said control unit is adapted to instruct said power supply unit to disconnect said power supply from said load.

20. The battery arrangement of claim 18, wherein said control unit is adapted to generate an alarm message if the capacity of one or more battery strings is below a sixth threshold value.

21. The battery arrangement of claim 12, wherein said load comprises an artificial load.

22. A battery arrangement to claim 21, wherein said control unit is adapted to instruct said artificial load to have preset power consumption.

23. The battery arrangement of claim 20, wherein said control unit is adapted to disconnect said at least one second battery string if the capacity of said at least one second battery string is below an seventh threshold value.

* * * * *